United States Patent
Guo et al.

(10) Patent No.: US 12,270,609 B2
(45) Date of Patent: Apr. 8, 2025

(54) HEAT DISSIPATION MEMBER AND ELECTRONIC APPARATUS

(71) Applicant: Lenovo (Beijing) Limited, Beijing (CN)

(72) Inventors: Lianming Guo, Beijing (CN); Huajun Dong, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 267 days.

(21) Appl. No.: 17/693,028

(22) Filed: Mar. 11, 2022

(65) Prior Publication Data
US 2023/0065452 A1    Mar. 2, 2023

(30) Foreign Application Priority Data
Aug. 19, 2021 (CN) .......................... 202110956680.4

(51) Int. Cl.
*F28D 15/04* (2006.01)
*H05K 7/20* (2006.01)

(52) U.S. Cl.
CPC ....... *F28D 15/046* (2013.01); *H05K 7/20309* (2013.01); *H05K 7/20318* (2013.01); *H05K 7/20336* (2013.01)

(58) Field of Classification Search
CPC .............. F28D 15/046; F28F 2255/18; H05K 7/20309; H05K 7/20318; H05K 7/20336
See application file for complete search history.

(56) References Cited

U.S. PATENT DOCUMENTS

| | | | | |
|---|---|---|---|---|
| 3,754,594 | A * | 8/1973 | Ferrell | F28D 15/046 165/272 |
| 4,489,777 | A * | 12/1984 | Del Bagno | F28D 15/046 165/104.26 |
| 2006/0162907 | A1 * | 7/2006 | Wu | F28D 15/046 165/146 |
| 2006/0283575 | A1 * | 12/2006 | Pai | F28D 15/046 165/104.26 |
| 2007/0193722 | A1 * | 8/2007 | Hou | F28D 15/0233 165/146 |
| 2007/0240858 | A1 * | 10/2007 | Hou | F28D 15/046 165/146 |
| 2007/0246194 | A1 * | 10/2007 | Hou | F28D 15/046 165/146 |
| 2014/0041838 | A1 * | 2/2014 | Lin | H01L 23/467 165/104.21 |
| 2018/0168069 | A1 * | 6/2018 | Wei | H05K 7/20336 |
| 2020/0149823 | A1 * | 5/2020 | Kawabata | F28D 15/046 |

FOREIGN PATENT DOCUMENTS

| | | |
|---|---|---|
| CN | 101025346 A | 8/2007 |
| WO | 2020252555 A1 | 12/2020 |

* cited by examiner

*Primary Examiner* — Eric S Ruppert
*Assistant Examiner* — Hans R Weiland
(74) *Attorney, Agent, or Firm* — ANOVA LAW GROUP, PLLC

(57) ABSTRACT

A heat dissipation member includes a condensation area, an evaporation area, and a capillary structure layer. The condensation area is arranged away from a heating element of an electronic apparatus in an application state. The evaporation area is arranged close to the heating element in the application state. A capillary force of the capillary structure layer in the evaporation area is greater than a capillary force of the capillary structure layer in the condensation area.

17 Claims, 3 Drawing Sheets

Evaporation area                                   Condensation area

Evaporation area                    Condensation area

HEAT DISSIPATION MEMBER AND ELECTRONIC APPARATUS

CROSS-REFERENCE TO RELATED APPLICATION

This application claims priority to Chinese Patent Application No. 202110956680.4, filed on Aug. 19, 2021, the entire content of which is incorporated herein by reference.

TECHNICAL FIELD

The present disclosure generally relates to the heat transfer device technology field and, more particularly, to a heat dissipation member and an electronic apparatus.

BACKGROUND

To improve portability and aesthetics of products, more and more industrial products are designed to be very thin. The thickness of an industrial product is gradually reduced, which causes the internal space of the industrial product to be further compressed. Therefore, thicknesses of components in the industrial product must also be reduced accordingly.

A heat dissipation member is used as a main heat dissipation device of many electronic industrial products. Once the thickness is reduced, heat dissipation performance will also be reduced accordingly, which will affect the overall performance of the product.

SUMMARY

Embodiments of the present disclosure provide a heat dissipation member, including a condensation area, an evaporation area, and a capillary structure layer. The condensation area is arranged away from a heating element of an electronic apparatus in an application state. The evaporation area is arranged close to the heating element in the application state. A capillary force of the capillary structure layer in the evaporation area is greater than a capillary force of the capillary structure layer in the condensation area.

Embodiments of the present disclosure provide an electronic apparatus, including a heat dissipation member. The heat dissipation member includes a condensation area, an evaporation area, and a capillary structure layer. The condensation area is arranged away from a heating element of an electronic apparatus in an application state. The evaporation area is arranged close to the heating element in the application state. A capillary force of the capillary structure layer in the evaporation area is greater than a capillary force of the capillary structure layer in the condensation area.

BRIEF DESCRIPTION OF THE DRAWINGS

The following drawings are merely examples for illustrative purposes according to various disclosed embodiments and are not intended to limit the scope of the present disclosure.

DETAILED DESCRIPTION OF THE EMBODIMENTS

Figure 1:
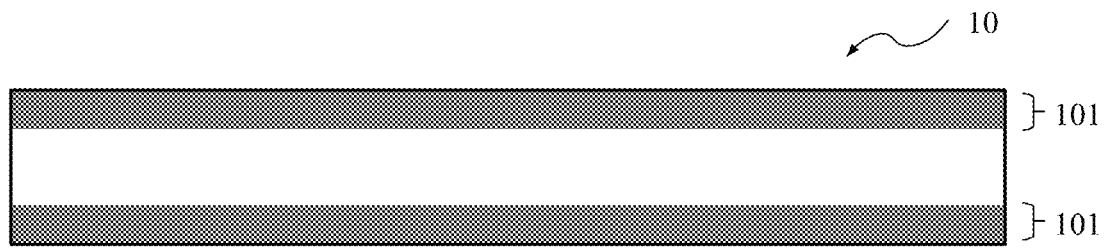
FIG. 1 illustrates a schematic structural diagram of a heat dissipation member according to some embodiments of the present disclosure.

The technical solutions of embodiments of the present disclosure are described in detail below with reference to the accompanying drawings of embodiments of the present disclosure. Specific embodiments described herein are merely used to explain the present disclosure but not to limit the present disclosure. In addition, to facilitate description, only a part of the present disclosure is shown in the drawings.

Unless otherwise defined, all technical and scientific terms used in the specification have the same meaning as commonly understood by one of ordinary skill in the art. The terms used in the specification are only for the purpose of describing embodiments of the present disclosure and are not intended to limit the present disclosure.

In the following description, "some embodiments," describes a subset of all possible embodiments. "Some embodiments" may be a same or a different subset of all possible embodiments, and may be combined with each other when there is no conflict.

The term "first\second\third" involved in embodiments of the present disclosure only distinguishes similar objects and does not represent a specific order of the objects. "First\second\third" may interchange a specific order or sequence by allowance. Thus, embodiments of the present disclosure described herein may be implemented in sequences other than those illustrated or described herein.

In order to make the objectives, technical solutions, and advantages of embodiments of the present disclosure more clear, embodiments of the present disclosure are be described in detail below in connection with the accompanying drawings. However, those of ordinary skill in the art can understand that, in embodiments of the present disclosure, many technical details are provided for readers to better understand the present disclosure. However, even without these technical details and various changes and modifications based on the following embodiments, the technical solutions of the present disclosure may be realized.

With a trend of thinning industrial products, a product thickness is gradually reduced, which compresses a thickness of a heat dissipation assembly. In particular, a heat pipe is a most critical heat transfer device in the heat dissipation assembly. As a thickness of the heat pipe decreases, heat dissipation performance of the heat dissipation assembly will also decrease accordingly, which affects application performance of the product. Therefore, an internal structure of the heat pipe may need to be adjusted and improved, so as to ensure that the performance of the heat pipe does not be affected as the thickness of the heat pipe is decreased.

In the existing technology, the heat pipe may include an evaporation area and a condensation area. The heat dissipation principle is as follows. A heat dissipation medium inside the heat pipe may absorb heat and vaporize in the evaporation area. The heat dissipation medium may be transferred from the evaporation area to the condensation area in a form of gas. Then, the gaseous heat dissipation medium may release heat and liquefies in the condensation area. The heat dissipation medium may return from the condensation area to the evaporation area in a liquid form.

In the existing technology, fine copper powders of uniform thickness may be usually used for de-sintering in an inner chamber of the entire heat pipe to obtain a sinter layer (i.e., a capillary structure layer). The copper powders may include particles of a same specification and size, thereby further producing uniform pores in the capillary structure layer to generate a capillary force. Thus, the liquid heat dissipation medium may be pulled from the condensation area back to the evaporation area.

However, the existing technology has the following disadvantages. (1) The pores of the capillary structure layer obtained by such uniform sintering are relatively large. According to the principle of the heat pipe generating the capillary force, the capillary force generated by such a pore structure is relatively small. Thus, a backflow of a liquid in the heat pipe cannot be improved, and the performance of the heat pipe cannot be improved. (2) Since a thickness of the capillary structure layer at an evaporation end and a condensation end is same, the generated capillary force is also the same. Thus, the backflow of the liquid in the heat pipe cannot be improved, and the best performance of the heat pipe cannot be exerted.

Embodiments of the present disclosure provide a heat dissipation member. The heat dissipation member may at least include a condensation area and an evaporation area. When the heat dissipation member is used, the evaporation area may be arranged close to the heating element of the electronic apparatus, and the condensation area may be arranged away from the heating element. The heat dissipation member may further include a capillary structure layer. A capillary force of the capillary structure layer in the evaporation area may be greater than a capillary force of the capillary structure layer in the condensation area. As such, since the capillary force of the capillary structure layer in the evaporation area is greater than the capillary force of the capillary structure layer in the condensation area, a condensate liquid may flow back from the condensation area to the evaporation area faster. Thus, heat dissipation efficiency of the heat dissipation member may be increased, the heat dissipation performance may be increased, which further improves the overall performance of the electronic apparatus.

Embodiments of the present disclosure are described in detail below in connection with the accompanying drawings.

In embodiments of the present disclosure, FIG. 1 illustrates a schematic structural diagram of a heat dissipation member 10 according to some embodiments of the present disclosure. As shown in FIG. 1, the heat dissipation member 10 includes a condensation area and an evaporation area. In an application state, the evaporation area may be arranged close to the heating element of the electronic apparatus, and the condensation area may be arranged away from the heating element.

The heat dissipation member 10 further includes a capillary structure layer 101. The capillary force of the capillary structure layer 101 in the evaporation area may be greater than the capillary force of the capillary structure layer 101 in the condensation area.

The heat dissipation member 10 of embodiments of the present disclosure may be applied to any mechanical apparatus or electronic apparatus that has a heat dissipation requirement. The mechanical apparatus may include a motor, a wind power device, an air conditioner, etc. The electronic apparatus may include a personal computer, a portable multimedia player, a handheld game console, a wireless communication terminal, etc. In embodiments of the present disclosure, the heat dissipation member 10 is described by taking the electronic apparatus as an example, which, however, does not limit embodiments of the present disclosure.

The heat dissipation member 10 realizes heat dissipation generally through evaporation and condensation of a heat dissipation medium (e.g., a condensate liquid, a cooling liquid, etc.). In some embodiments, the heat dissipation member 10 includes the evaporation area and the condensation area. The evaporation area may be close to the heating element of the electronic apparatus, and the condensation area may be away from the heating element of the electronic apparatus. The liquid heat dissipation medium may absorb heat in the evaporation area and be converted into gas and transferred to the condensation area. Then, the gaseous heat-dissipating medium may release heat in the condensation area, be converted into the liquid again, and return to the evaporation area.

An inner wall of the heat dissipation member 10 includes the capillary structure layer 101, which may control the backflow of the liquid heat dissipation medium by the capillary force. In embodiments of the present disclosure, the capillary force of the capillary structure layer 101 in the evaporation area may be greater than the capillary force of the capillary structure layer 101 in the condensation area, so that the liquid heat dissipation medium may flow back faster from the condensation area to the evaporation area. Thus, a circulation of the heat dissipation medium may be accelerated, the heat dissipation efficiency may be improved, and the heat dissipation performance of the heat dissipation member 10 may be improved.

The capillary force of the capillary structure layer 101 may be set according to the thickness of capillary structure layer 101 and/or porosity of the capillary structure layer 101.

In embodiments of the present disclosure, the thickness of the capillary structure layer 101 can be controlled to be different in the evaporation area and in the condensation area, the porosity of the capillary structure layer 101 can be controlled to be different in the evaporation area and the condensation area, or both the thickness and the porosity of the capillary structure layer 101 can be controlled to be different in the evaporation area and the condensation area. Thus, the capillary force of the capillary structure layer 101 in the evaporation area may be greater than the capillary force of the capillary structure layer 101 in the condensation area.

Further, in some embodiments, the heat dissipation member 10 further may include an intermediate area. The intermediate area may be located between the evaporation area and the condensation area.

The thickness of the capillary structure layer 101 in the evaporation area may be greater than a thickness of the capillary structure layer 101 in the intermediate area. The thickness of the capillary structure layer 101 in the intermediate area may be greater than the thickness of the capillary structure layer 101 in the condensation area.

In some other embodiments, the thickness of the capillary structure layer 101 gradually decreases in the evaporation area, the intermediate area, and the condensation area.

Between the evaporation area and the condensation area, the heat dissipation member 10 may further include the intermediate area. At this time, the thickness of the capillary structure layer 101 in the intermediate area may be a fixed value. The fixed value may be between the thickness of the capillary structure layer 101 in the evaporation area and the thickness of the capillary structure layer 101 in the condensation area.

In some other embodiments, the thickness of the capillary structure layer in the intermediate area may be a gradually changing value. At this time, the thickness of the capillary structure layer 101 may gradually decrease in the evaporation area, the intermediate area, and the condensation area. Thus, with the above two designs, the capillary force of the capillary structure layer 101 in the intermediate area may be smaller than the capillary force of the capillary structure layer 101 in the evaporation area and greater than the capillary force of the capillary structure layer 101 in the condensation area.

Similarly, in some other embodiments, the heat dissipation member 10 may further include the intermediate area. The intermediate area may be located between the evaporation area and the condensation area.

The porosity of the capillary structure layer 101 in the evaporation area may be smaller than porosity of the capillary structure layer 101 in the intermediate area. The porosity of the capillary structure layer in the intermediate area may be smaller than the porosity of the capillary structure layer 101 in the condensation area.

In some other embodiments, the porosity of the capillary structure layer 101 may gradually increase in the evaporation area, the intermediate area, and the condensation area.

For a setting method of the porosity, reference may be made to the designs of the thickness, so that the capillary force of the capillary structure layer 101 in the intermediate area may be smaller than the capillary force of the capillary structure layer 101 in the evaporation area and greater than the capillary force of the capillary structure layer 101 in the condensation area.

Further, the heat dissipation member 10 may be formed by processing with a predetermined shape. The predetermined shape may at least include a heat pipe or a heat dissipation plate (i.e., a heat conduction plate). Therefore, in some embodiments, the heat dissipation member 10 may be the heat pipe. A heat dissipation medium may be arranged in a hollow structure of the heat pipe. A pipe body of the heat pipe may include the capillary structure layer 101.

In some other embodiments, the heat dissipation member 10 may be a heat dissipation plate. The heat dissipation plate may include a plurality of heat dissipation chambers. The heat dissipation medium may be arranged in the plurality of heat dissipation chambers. The heat dissipation chambers may include the capillary structure layer 101.

The heat dissipation member 10 may include various specific heat dissipation methods, such as a heat pipe or a heat dissipation plate. The heat pipe may include an U-shaped heat pipe, an L-shaped heat pipe, a sickle-shaped heat pipe, a cylindrical heat pipe, etc.

Regardless of the heat pipe, the heat conduction plate, or another heat dissipation component, one or more heat dissipation chambers may exist. The capillary structure layer 101 may be provided on an inner wall of the heat dissipation chamber. That is, each heat dissipation chamber may include an evaporation area and a condensation area. A capillary force of the capillary structure layer 101 in the evaporation area may be greater than the capillary force of the capillary structure layer 101 in the condensation area, so that the heat dissipation medium in the heat dissipation chamber can flow back faster. Thus, the heat dissipation capacity may be improved.

The heat dissipation chamber may include various forms. For example, for the heat pipe, the plurality of heat dissipation chambers may be nested. For the heat conduction plate, the plurality of heat dissipation chambers may be arranged in parallel.

Taking a single-layer heat pipe as an example, the heat pipe may include a cylindrical pipe body. The heat dissipation medium may be arranged in the cylindrical pipe body. The capillary structure layer 101 may be arranged on a surface of the cylindrical pipe body. As such, one end of the cylindrical heat pipe may include the evaporation area, and the other end of the cylindrical heat pipe may include the condensation area. Since the capillary force of the capillary structure layer 101 in the evaporation area is greater than the capillary force of the capillary structure layer 101 in the condensation area, the heat dissipation medium can flow back from the condensation area to the evaporation area faster. Thus, the heat dissipation capacity of the heat pipe may be improved.

Taking a multi-layer heat pipe as an example, the heat pipe may include a number n annular pipe bodies. An i-th annular pipe body may be nested at the outside of an i−1-th annular pipe body. A hollow chamber among the number n annular pipe bodies may accommodate the heat dissipation medium. i and n are both integers greater than 1, and i is less than or equal to n. The number n annular pipes may include the capillary structure layers 101.

A plurality of annular tube bodies may form a nested structure. The capillary structure layer 101 may be sintered on inner and outer surfaces of a first to n-lth annular pipe bodies and on an inner surface of the n-th annular pipe body. For the number n annular heat pipes, one end may be the evaporation area, and the other end may be the condensation area. For each annular heat pipe, the capillary force of the capillary structure layer 101 in the evaporation area is greater than the capillary force of the capillary structure layer 101 in the condensation area. Thus, the heat dissipation medium can flow back faster from the condensation area to the evaporation area, and the heat dissipation ability of the heat pipe may be improved.

Embodiments of the present disclosure provide the heat dissipation member. The heat dissipation member may include at least a condensation area and an evaporation area. In the application state, the evaporation area may be arranged close to the heating element of the electronic apparatus. The condensation area may be arranged away from the heating element. The heat dissipation member may also include the capillary structure layer. The capillary force of the capillary structure layer in the evaporation area may be greater than the capillary force of the capillary structure layer in the condensation area. As such, since the capillary force of the capillary structure layer in the evaporation area is greater than the capillary force of the capillary structure layer in the condensation area, the condensate liquid can flow back faster from the condensation area to the evaporation area. Thus, the heat dissipation efficiency of the heat dissipation member may be improved, the heat dissipation performance of the heat dissipation member may also be improved, and the overall performance of the electronic apparatus may be improved.

Figure 2:
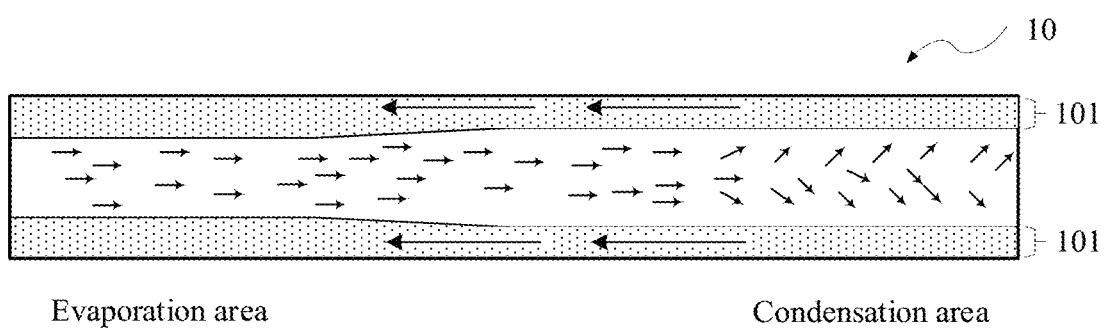
FIG. 2 illustrates a schematic structural diagram of another heat dissipation member according to some embodiments of the present disclosure.

In some other embodiments of the present disclosure, FIG. 2 illustrates a schematic structural diagram of another heat dissipation member 10 according to some embodiments of the present disclosure. As shown in FIG. 2, the heat dissipation member 10 includes a condensation area and an evaporation area. In the application state, the evaporation area may be arranged close to the heating element of the electronic apparatus, and the condensation area may be arranged away from the heating element.

The heat dissipation member 10 further includes a capillary structure layer 101. A thickness of the capillary structure layer 101 in the evaporation area may be greater than a thickness of the capillary structure layer 101 in the condensation area. Thus, a capillary force of the capillary structure layer 101 in the evaporation area may be greater than a capillary force of the capillary structure layer 101 in the condensation area.

According to the principle of generating the capillary force, the thicker the capillary structure layer 101 is, the greater the capillary force the capillary structure layer 101 can generate. Therefore, a thicker capillary structure layer 101 may be arranged in the condensation area, and a thinner capillary structure layer 101 may be arranged in the evaporation area.

Further, in some embodiments, the heat dissipation member 10 may further include an intermediate area. The intermediate area may be located between the evaporation area and the condensation area.

The thickness of the capillary structure layer 101 in the evaporation area may be greater than the thickness of the capillary structure layer 101 in the intermediate area. The thickness of the capillary structure layer 101 in the intermediate area may be greater than the thickness of the capillary structure layer 101 in the condensation area.

The intermediate area of the heat dissipation member 10 may be between the evaporation area and the condensation area. That is, the liquid dissipation medium may need to pass through the condensation area, the intermediate area, and the evaporation area in sequence during a flow back process. Therefore, the thickness of the capillary structure layer 101 may be controlled to be gradually decreased along the condensation area, the intermediate area, and the evaporation area, so that the flow back rate of the heat dissipation medium may be accelerated, and the heat dissipation efficiency may be improved. A shape of the capillary structure layer 101 may be set to be inclined in the intermediate area. That is, the thickness of the capillary structure layer 101 may vary in the intermediate area. In some other embodiments, the shape of the capillary structure layer 101 can be set to be linear in the intermediate area. That is, the thickness of the capillary structure layer 101 may be a fixed value in the intermediate area. The fixed value may range between the thickness in the condensation area and the thickness in the evaporation area.

Exemplarily, the thickness of the capillary structure layer 101 in the evaporation area may have a first value. The thickness of the capillary structure layer 101 in the intermediate area may be gradually decreased from the first value to a second value. The thickness of the capillary structure layer 101 in the condensation section may have the second value. The first value may be greater than the second value. Specific values of the first value and the second value may be determined according to application scenarios. For example, the first value may be 1.6 mm and the second value may be 1.2 mm.

Further, in some embodiments, from a perspective of thermodynamics, the intermediate area of the heat dissipation member 10 may be further divided into a transition area and a thermal insulation area. In the heat dissipation member 10, the evaporation area, the transition area, the thermal insulation area, and the condensation area may be distributed in sequence. Similarly, the capillary structure layer 101 may decrease sequentially along the evaporation area, the transition area, the thermal insulation area, and the condensation area. For example, the thickness of the capillary structure layer 101 in the evaporation area may be 1.6 mm, the thickness of the capillary structure layer 101 in the transition area may be gradually reduced from 1.6 mm to 1.2 mm, and the thickness of the capillary structure layer 101 in the thermal insulation area and the condensation area may both be 1.2 mm.

In summary, in the existing technology, in the inner chamber of the whole heat pipe, fine copper powders with the uniform thickness may need to be used for de-sintering to obtain the capillary structure layer with the uniform thickness. Thus, uniform pores may be generated in the sinter layer to generate the capillary force. However, since the thickness of the sinter layer at the evaporation end (i.e., the evaporation area) and the thickness of the sinter layer at the condensation end (i.e., the condensation area) may be the same, the generated capillary forces are also the same. Therefore, the backflow of the liquid in the heat pipe cannot be improved, and the best performance of the heat pipe may not be exerted.

That is, the heat pipe may include the evaporation end and the condensation end. If the backflow speed of the liquid can be increased, the performance of the heat pipe may be improved. Therefore, according to characteristics of the heat pipe and actual needs, fine copper powders with different thicknesses may be filled at the inner surface of the heat pipe. The copper powders may form a non-uniform capillary structure layer 101 after sintering. That is, the thickness of the capillary structure layer 101 may gradually increase from the condensation end to the evaporation end at the sinter layer. As such, the non-uniform capillary structure layer 101 may have a thicker sinter layer at the evaporation end to generate a larger capillary force, which can quickly pull the liquid at the condensation end back to the evaporation end. Thus, a conversion rate of the liquid inside the heat pipe into gas may be accelerated per unit time, thereby improving the performance of the heat pipe.

In embodiments of the present disclosure, a heat pipe 1 having a capillary structure layer 101 with a non-uniform thickness may be also prepared according to the method in the existing technology. The heat pipe 1 is tested under the condition when the heat generation value is 18 watts (W) and 30 W. The results are shown in Table 1 and Table 2.

TABLE 1

| Machine type DAH085 | Specification Heat pipe 1 (18 W) | | Operation temperature | Water temperature 45° C. | Temperature difference |
| --- | --- | --- | --- | --- | --- |
| No. | Qin (W) | TC (W) | T1 (° C.) | T2 (° C.) | T3 (° C.) | T1 − T3 |
| 1 | 18 | 52.37 | 48.4 | 47.57 | 47.2 | 1.2 |
| 2 | 18 | 51.75 | 48.8 | 47.9 | 47.37 | 1.4 |
| 3 | 18 | 53.01 | 48.8 | 48.47 | 47.6 | 1.2 |
| 4 | 18 | 51.68 | 48.75 | 47.97 | 47.31 | 1.4 |
| 5 | 18 | 51.97 | 48.9 | 48.01 | 47.76 | 1.1 |
| 6 | 18 | 52.27 | 48.7 | 47.3 | 48.23 | 1.5 |
| 7 | 18 | 54.22 | 49.95 | 49.3 | 48.64 | 1.3 |
| 8 | 18 | 55.77 | 49.34 | 49.02 | 48.01 | 1.3 |
| 9 | 18 | 53.31 | 49.39 | 49 | 48.33 | 1.1 |
| 10 | 18 | 52.44 | 49.06 | 48.67 | 47.76 | 1.3 |
| 11 | 18 | 53.06 | 49.26 | 48.93 | 48.11 | 1.2 |
| 12 | 18 | 51.95 | 48.75 | 47.64 | 47.62 | 1.1 |
| 13 | 18 | 51.54 | 48.72 | 47.47 | 47.44 | 1.3 |
| 14 | 18 | 52.18 | 48.46 | 48.19 | 47.25 | 1.2 |

TABLE 1-continued

| Machine type DAH085 | Specification Heat pipe 1 (18 W) | | Operation temperature | Water temperature 45° C. | Temperature |
|---|---|---|---|---|---|
| No. | Qin (W) | TC (W) | T1 (° C.) | T2 (° C.) | T3 (° C.) | difference T1 − T3 |
| 15 | 18 | 52.86 | 49.69 | 48.79 | 48.38 | 1.3 |
| Mean | | 52.69 | 49.00 | 48.28 | 47.73 | 1.26 |

TABLE 2

| Machine type DAH085 | Specification Heat pipe 1 (18 W) | | Operation temperature | Water temperature 45° C. | Temperature |
|---|---|---|---|---|---|
| No. | Qin (W) | TC (W) | T1 (° C.) | T2 (° C.) | T3 (° C.) | difference T1 − T3 |
| 1 | 30 | 68.41 | 60.02 | 59.44 | 58.17 | 1.9 |
| 2 | 30 | 69.55 | 60.94 | 60.65 | 59.57 | 1.4 |
| 3 | 30 | 70.2 | 60.57 | 60.05 | 58.68 | 1.9 |
| 4 | 30 | 69.55 | 63.97 | 63.73 | 61.38 | 2.6 |
| 5 | 30 | 70.86 | 60.77 | 60.84 | 59.23 | 1.5 |
| 6 | 30 | 69.2 | 61.96 | 61.2 | 59.9 | 2.1 |
| 7 | 30 | 68.2 | 59.82 | 59 | 57.6 | 2.2 |
| 8 | 30 | 71.34 | 63.2 | 62.8 | 60.7 | 2.5 |
| 9 | 30 | 70.25 | 61.54 | 61 | 59.64 | 1.9 |
| 10 | 30 | 72.32 | 63.9 | 62.85 | 61.9 | 2 |
| 11 | 30 | 68.51 | 59.15 | 58.4 | 57.1 | 2.1 |
| 12 | 30 | 69.4 | 60.76 | 60.01 | 58.52 | 2.2 |
| 13 | 30 | 71.65 | 62.9 | 62.3 | 61.54 | 1.4 |
| 14 | 30 | 68.8 | 59.96 | 58.52 | 57.68 | 2.3 |
| 15 | 30 | 72.3 | 63.45 | 62.91 | 61.75 | 1.7 |
| Mean | | 70.04 | 61.53 | 60.91 | 59.56 | 1.98 |

In Tables 1 and 2, ° C. is a temperature unit and denotes Celsius degree. Qin and TC are used to denote different heats. T1, T2, and T3 denote different temperatures, respectively. In particular, Qin indicates the heat generation value.

As shown in Table 1 and Table 2, when the heat generation value is 18 W, a mean temperature difference between a head end and a tail end of the heat pipe 1 is 1.26° C. When the heat generation value is 30 W, a mean temperature difference of the head and the tail of the heat pipe is 1.98° C. Both mean temperature differences are lower than the mean temperature difference of the heat pipe in the existing technology.

Figure 3:
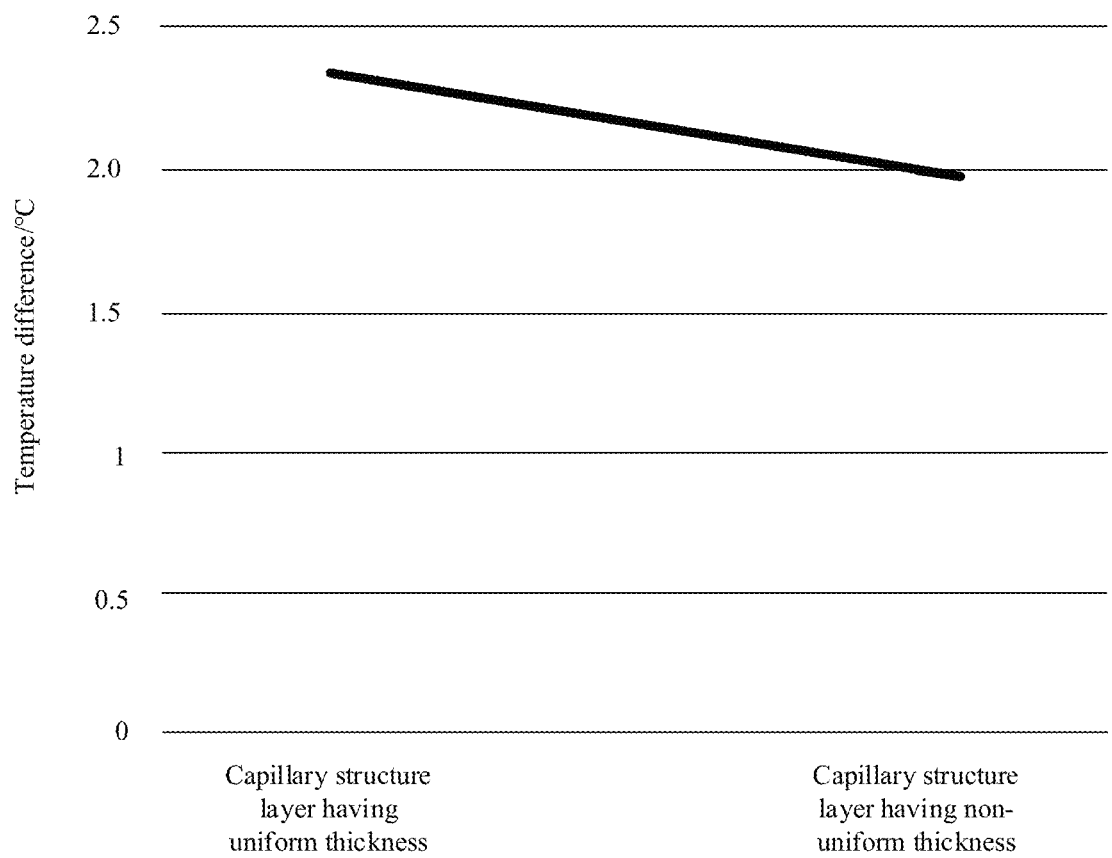
FIG. 3 illustrates a schematic diagram showing a test result of a heat dissipation member according to some embodiments of the present disclosure.

As shown in FIG. 3, when the heat generation value is 30 W, in the existing technology, a temperature difference between the head and the tail of the heat pipe using the capillary structure layer with the uniform thickness is about 2.48° C. However, in embodiments of the present disclosure, a temperature difference between the head and the tail of the heat pipe using the capillary structure layer with the non-uniform thickness is 1.98° C. The temperature difference of embodiments of the present disclosure is 0.5° C. lower than the temperature difference of the existing technology. Thus, the heat dissipation capability of the heat pipe with the capillary structure layer with the non-uniform thickness is better.

Embodiments of the present disclosure provide a heat dissipation member. A specific implementation method of embodiments of the present disclosure is described in detail here. Since the capillary force of the capillary structure layer in the evaporation area is greater than that the capillary force of the capillary structure layer in the condensation area. The condensate liquid can flow from the condensation area back to the evaporation area faster, so that the heat dissipation efficiency of the heat dissipation member can be improved, and the heat dissipation performance can also be improved. Thus, the overall performance of the electronic apparatus may be improved.

Figure 4:
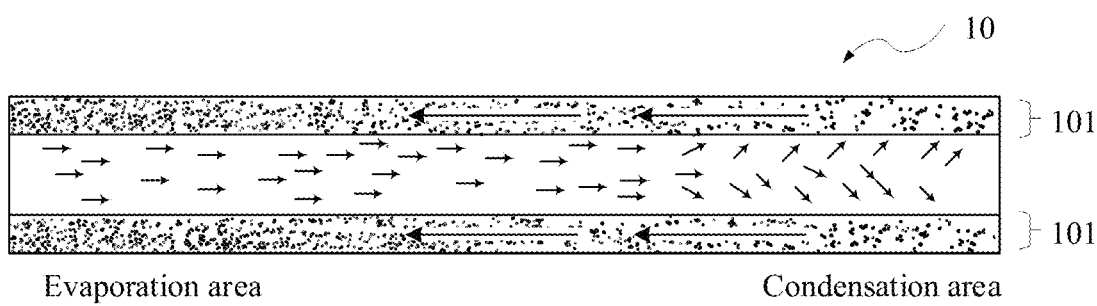
FIG. 4 illustrates a schematic structural diagram of still another heat dissipation member according to some embodiments of the present disclosure.

In another embodiment of the present disclosure, FIG. 4 illustrates a schematic structural diagram of still another heat dissipation member according to some embodiments of the present disclosure. As shown in FIG. 4, the heat dissipation member 10 includes at least a condensation area and an evaporation area. In the application state, the evaporation area may be arranged close to the heating element of the electronic apparatus. The condensation area may be arranged away from the heating element.

The heat dissipation member 10 further includes a capillary structure layer 101. The porosity of the capillary structure layer 101 in the evaporation area may be smaller than the porosity of the capillary structure layer 101 in the condensation area. Thus, the capillary force of the capillary structure layer 101 in the evaporation area may be greater than the capillary force of the capillary structure layer 101 in the condensation area.

According to the generation principle of the capillary force, the smaller the porosity of the capillary structure layer 101 is, the larger the capillary force is. Therefore, the capillary structure layer 101 with lower porosity may be provided in the condensation area, and the capillary structure layer 101 with higher porosity may be provided in the evaporation area. The porosity refers to a void ratio formed among particles in the capillary structure layer 101.

Further, in some embodiments, the heat dissipation member 10 may further include an intermediate area. The intermediate area may be located between the evaporation area and the condensation area.

The porosity of the capillary structure layer 101 in the evaporation area may be smaller than the porosity of the capillary structure layer 101 in the intermediate area. The porosity of the capillary structure layer 101 in the intermediate area may be smaller than the porosity of the capillary structure layer 101 in the condensation area.

Similarly, if the heat dissipation member 10 further includes the intermediate area, the porosity of the capillary structure layer 101 may gradually decrease along the condensation area, the intermediate area, and the evaporation area.

Further, in some embodiments, the part of the capillary structure layer 101 in the evaporation area may be obtained by sintering first raw material particles. The part of the capillary structure layer 101 in the condensation area may be obtained by sintering second raw material particles.

An average particle diameter of the first raw material particles may be smaller than an average particle diameter of the second raw material particles. As such, the porosity of the capillary structure layer 101 in the evaporation area may be smaller than the porosity of the capillary structure layer 101 in the condensation area.

In embodiments of the present disclosure, different areas of the capillary structure layer 101 may be obtained by sintering different raw material particles. In some embodiments, the part of the capillary structure layer 101 in the evaporation area may be obtained by sintering the first raw material particles with the smaller average particle diameter. The part of the capillary structure layer 101 in the condensation area may be obtained by sintering the second raw material particles with the larger average particle diameter. As such, the porosity of the capillary structure layer 101 in the evaporation area may be smaller than the porosity of the capillary structure layer 101 in the condensation area.

Here, the first raw material particles or the second raw material particles may be formed by mixing at least one size particles, so as to further reduce the porosity. For example, the first raw material particles and the second raw material particles may include first particles, second particles, third particles, and fourth particles. The first particles, the second particles, the third particles, and the fourth particles may have different particle diameters.

In the first raw material particles, a volume ratio of the first particles, the second particles, the third particles, and the fourth particles may be a first ratio.

In the second raw material particles, a volume ratio of the first particles, the second particles, the third particles, and the fourth particles may be a second ratio.

The first ratio may be different from the second ratio, so that the average particle diameter of the first raw material particles may be smaller than the average particle diameter of the second raw material particles.

As such, the first raw material particles and the second raw material particles may be formed by mixing four kinds of particles with different particle diameters. By controlling the mixing ratio of the first raw material particles and the mixing ratio of the second raw material particles to be different, so that the average particle diameter of the first raw material particles may be smaller than the average particle diameter of the second raw material particles.

In some embodiments, a particle diameter of the first particle may be 60 mesh, a particle diameter of the second particle may be 80 mesh, a particle diameter of the third particle may be 120 mesh, and a particle diameter of the fourth particle may be 150 mesh. The first ratio may be 53:84:751:112, and the second ratio may be 783:154:48:15.

The first raw material particles and the second raw material particles may be composed of copper powder particles. Therefore, in some embodiments, a sintering temperature of the capillary structure layer 101 may be 980° C., and sintering time of the capillary structure layer 101 may be 120 minutes.

In some other embodiments, the capillary force of the capillary structure layer in different areas may also be ignored. However, the first raw material particles and the second raw material particles may be mixed, so that non-uniform copper powder may be obtained. The mixed copper powder may be sintered to obtain a capillary structure layer. As such, although the porosity of the capillary structure layer is approximately the same, the overall porosity of the capillary structure layer may be reduced. Thus, the capillary force of the entire capillary structure layer may be improved, which may improve the heat dissipation efficiency.

In the existing technology, fine copper powder is used for sintering to obtain a capillary structure layer. The copper powder includes particles with a same specification and a same particle diameter. Thus, a pore size in the sinter layer is the same after sintering, and the pore size is relatively large. According to the principle of the heat pipe generating the capillary force, the capillary force generated by this pore structure is relatively small. Thus, the performance of the heat pipe cannot be improved. That is, the pore size of this conventional sinter layer is relatively large. According to the principle of the heat pipe generating the capillary force, the capillary force generated by the pore structure is relatively small. Thus, the backflow of the liquid in the heat pipe cannot be improved. Therefore, the performance of the heat pipe cannot be improved.

Therefore, particle copper powder with different shapes and sizes may be used and mixed in a certain ratio to form a new powder for a sinter layer. In the new sinter layer, a microstructure of a large particle covering a small particle may be formed in the mixed powder. Thus, a structure with a relatively small porosity may be formed. Since the powder may be sintered to form a smaller microstructure, according to the principle of generation of the capillary force, the capillary force may be enlarged with the smaller porosity. Thus, the performance of the heat pipe can be improved with the same thickness.

Thus, in embodiments of the present disclosure, the non-uniform raw material particles obtained by mixing the first raw material particles and the second raw material particles may be used to sinter the capillary structure layer. Then, the heat pipe 2 may be obtained. The heat pipe 2 may be tested when the heat generation value is 18 W and 30 W, and the results are shown in Tables 3 and 4.

TABLE 3

| Machine type DAH085 | Specification Heat pipe 2 (18 W) | Operation temperature | Water temperature 45° C. | Temperature |
|---|---|---|---|---|
| No. | Qin (W) | TC (W) | T1 (° C.) | T2 (° C.) | T3 (° C.) | difference T1 − T3 |
| 1 | 18 | 52.71 | 49.85 | 48.92 | 48.6 | 1.3 |
| 2 | 18 | 52.16 | 49.96 | 48.7 | 48.93 | 2 |
| 3 | 18 | 52.87 | 49.33 | 48.74 | 47.85 | 1.5 |
| 4 | 18 | 52.65 | 49.49 | 48.31 | 47.88 | 1.6 |
| 5 | 18 | 52.61 | 49.56 | 48.94 | 48.51 | 1.1 |
| 6 | 18 | 52.45 | 49.12 | 48.57 | 47.85 | 1.3 |
| 7 | 18 | 55.72 | 49.73 | 49.12 | 48.79 | 0.9 |
| 8 | 18 | 52.58 | 49.79 | 48.59 | 48.29 | 1.5 |
| 9 | 18 | 52.58 | 49.07 | 48.89 | 48.22 | 0.9 |
| 10 | 18 | 52.66 | 48.91 | 48.4 | 47.88 | 1 |
| 11 | 18 | 53.45 | 49.72 | 48.89 | 48.51 | 1.2 |
| 12 | 18 | 53.76 | 49.52 | 48.93 | 48.39 | 1.1 |
| 13 | 18 | 54.07 | 49.71 | 48.75 | 48.42 | 1.3 |
| 14 | 18 | 55.43 | 49.62 | 48.09 | 47.72 | 1.9 |
| 15 | 18 | 52.75 | 48.67 | 48.48 | 47.19 | 1.5 |
| Mean | | 53.22 | 48.47 | 48.69 | 48.14 | 1.34 |

TABLE 4

| Machine type DAH085 | Specification Heat pipe 2 (18 W) | Operation temperature | Water temperature 45° C. | Temperature |
|---|---|---|---|---|
| No. | Qin (W) | TC (W) | T1 (° C.) | T2 (° C.) | T3 (° C.) | difference T1 − T3 |
| 1 | 30 | 70.3 | 59.6 | 59.3 | 58.3 | 1.3 |
| 2 | 30 | 71.2 | 60.2 | 59.8 | 58.1 | 2.1 |
| 3 | 30 | 68.7 | 59.9 | 59 | 57.6 | 2.3 |
| 4 | 30 | 69.6 | 61.9 | 60.9 | 60.1 | 1.8 |
| 5 | 30 | 70.6 | 60.7 | 59.8 | 58.4 | 2.3 |
| 6 | 30 | 68.2 | 59.1 | 58.2 | 57.1 | 2 |
| 7 | 30 | 71.4 | 61.5 | 60.4 | 58.7 | 2.8 |
| 8 | 30 | 69.2 | 59.9 | 58.5 | 57.2 | 2.7 |
| 9 | 30 | 70.8 | 61.5 | 60.8 | 60 | 1.5 |
| 10 | 30 | 68.5 | 60.3 | 59.7 | 58.2 | 2.1 |
| 11 | 30 | 71.9 | 63.4 | 63 | 60.6 | 2.8 |
| 12 | 30 | 69.5 | 59.9 | 59.4 | 58 | 1.9 |
| 13 | 30 | 70.8 | 60.3 | 59.9 | 58.4 | 1.9 |
| 14 | 30 | 68.2 | 59.6 | 57.1 | 56.8 | 2.8 |
| 15 | 30 | 70.9 | 64 | 63.7 | 61.8 | 2.2 |
| Mean | | 69.99 | 60.79 | 59.97 | 58.62 | 2.17 |

According to Table 3 and Table 4, when the heat generation value is 18 W, the average temperature difference between the head end and the tail end of the heat pipe 2 is 1.34° C. When the heat generation value is 30 W, the average temperature difference between the head end and the tail end of the heat pipe 2 is 2.17° C. The average temperature differences of the heat pipe 2 are lower than the average temperature difference of the heat pipe in the existing technology.

Figure 5:
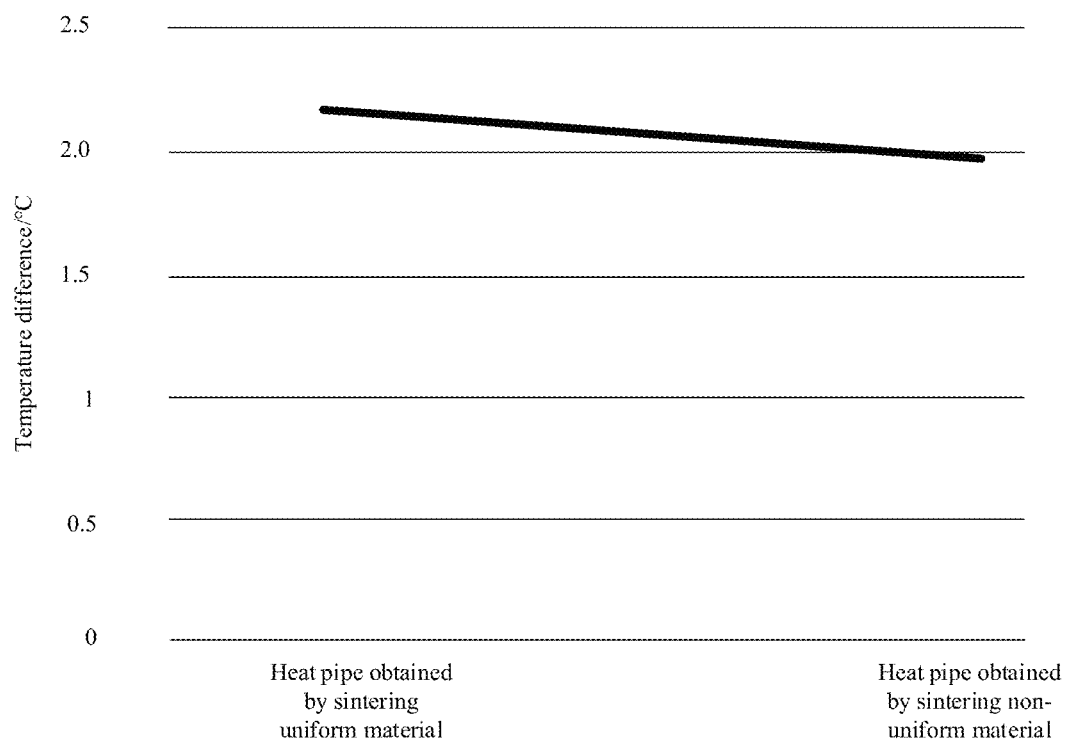
FIG. 5 illustrates a schematic diagram showing a test result of the another heat dissipation member according to some embodiments of the present disclosure.

As shown in FIG. 5, when the heat generation value is 30 W, the temperature difference between the head and tail of the heat pipe obtained by sintering the uniform raw materials is generally 2.47° C., while the temperature difference between the head and tail of the heat pipe obtained by sintering the non-uniform raw materials is 2.17° C. Compared to the existing technology, the temperature difference of the heat pipe obtained by sintering the non-uniform raw materials is lowered by 0.3° C. Thus, the heat dissipation capability of the heat pipe having the capillary structure layer with the non-uniform porosity is better.

Based on above, in connection with the idea of setting the non-uniform capillary force, the capillary structure layer 101 may be controlled to have different porosities at the evaporation end and the condensation end. As such, the capillary force of the capillary structure layer 101 at the evaporation end may be larger than the capillary force of the capillary structure layer 101 at the condensation end, which may further improve the performance of the heat pipe.

Embodiments of the present disclosure provide a heat dissipation member. The specific implementation method of embodiments of the present disclosure is described in detail. Since the capillary force of the capillary structure layer in the evaporation area is greater than that the capillary force of the capillary structure layer in the condensation area, the condensate liquid can flow from the condensation area back to the evaporation area faster. Thus, the heat dissipation efficiency of the heat dissipation member may be improved, and the heat dissipation performance may also be improved. As such, the overall performance of the electronic apparatus may be further improved.

Embodiments of the present disclosure provide the heat dissipation member. The heat dissipation member may at least include the condensation area and the evaporation area. In the application state, the evaporation area may be arranged close to the heating element of the electronic apparatus. The condensation area may be arranged away from the heating element.

The porosity of the capillary structure layer in the evaporation area may be smaller than the porosity of the capillary structure layer in the condensation area. The thickness of the capillary structure layer in the evaporation area may be greater than the thickness of the capillary structure layer in the condensation area. Thus, the capillary force of the capillary structure layer in the evaporation area is greater than the capillary force of the capillary structure layer in the condensation area.

The thickness and porosity of the capillary structure layer may be controlled at the same time, so that the capillary force of the capillary structure layer in the evaporation area may be more efficiently controlled to be greater than the capillary force of the capillary structure layer in the condensation area.

For example, the first raw material particles may be used as the sinter raw material in the evaporation area. The second raw material particles may be used as the sinter raw material in the condensation area. The capillary structure layer in the evaporation area may be controlled to be relatively thick, and the capillary structure layer in the condensation area may be controlled to be relatively thin, simultaneously.

Further, in some embodiments, the heat dissipation member may further include the intermediate area. The intermediate area may be located between the evaporation area and the condensation area.

The thickness of the capillary structure layer in the evaporation area may be greater than the thickness of the capillary structure layer in the intermediate area. The thickness of the capillary structure layer in the intermediate area may be greater than the thickness of the capillary structure layer in the condensation area.

The porosity of the capillary structure layer in the evaporation area may be smaller than the porosity of the capillary structure layer in the intermediate area. The porosity of the capillary structure layer in the intermediate area may be smaller than the porosity of the capillary structure layer in the condensation area. Thus, the capillary force of the capillary structure layer in the evaporation area may be greater than the capillary force of the capillary structure in the condensation area.

Embodiments of the present disclosure provide a heat dissipation member. The specific implementation method of embodiments of the present disclosure is described in detail. The capillary force of the capillary structure layer in the evaporation area may be greater than the capillary force of the capillary structure layer in the condensation area. The condensate liquid may flow from the condensation area back to the evaporation area faster. As such, the heat dissipation efficiency of the heat dissipation member may be improved, and the heat dissipation performance may also be improved. Thus, the overall performance of the electronic apparatus may be further improved.

Figure 6:
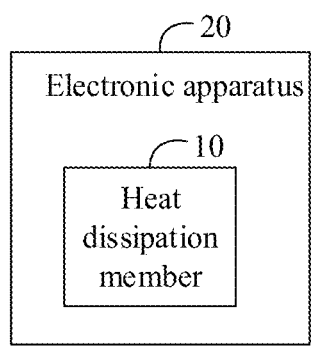
FIG. 6 illustrates a schematic structural diagram of an electronic apparatus according to some embodiments of the present disclosure.

In some other embodiments of the present disclosure, FIG. 6 illustrates a schematic structural diagram of an electronic apparatus 20 according to some embodiments of the present disclosure. The electronic apparatus 20 includes the heat dissipation member 10 of embodiments of the present disclosure.

In embodiments of the present disclosure, the electronic apparatus 20 includes the heat dissipation member 10. Since the capillary force of the capillary structure layer in the evaporation area is greater than the capillary force of the capillary structure layer in the condensation area, the condensate liquid may flow from the condensation area back to the evaporation area faster. As such, the heat dissipation efficiency of the heat dissipation member may be improved, and the heat dissipation performance may also be improved. Thus, the overall performance of the electronic apparatus may be further improved.

The above description describes only some embodiments of the present disclosure and is not intended to limit the scope of the present disclosure.

In the present disclosure, the terms "comprising," "including," or any other variation thereof are intended to encompass non-exclusive inclusion, such that a process, method, article, or device that includes a series of elements includes not only those elements, but also other elements not listed or inherent to the process, method, article or device. Without further limitation, an element defined by the phrase "comprising a" does not exclude a presence of an additional identical element in the process, method, article or device that includes the element.

The above-mentioned serial numbers of embodiments of the present disclosure are only for description, and do not represent the advantages or disadvantages of the embodiments.

The methods disclosed in method embodiments of the present disclosure may be arbitrarily combined to obtain new method embodiments when there is no conflict.

The features disclosed in product embodiments of the present disclosure may be combined arbitrarily to obtain new product embodiments when there is no conflict.

The features disclosed in method or device embodiments of the present disclosure may be combined arbitrarily to obtain new method embodiments or device embodiments when there is no conflict.

The above description describes only specific embodiments of the present disclosure, but the scope of the present disclosure is not limited to this. Those skilled in the art can easily think of changes or replacements within the technical scope of the present disclosure. These changes or replacements should be within the scope of the present disclosure. Therefore, the scope of the present invention should be subject to the scope of the claims.

What is claimed is:

1. A heat dissipation member, comprising:
a condensation area arranged away from a heating element of an electronic apparatus in an application state;
an evaporation area arranged close to the heating element in the application state; and
a capillary structure layer, a capillary force of the capillary structure layer in the evaporation area being greater than a capillary force of the capillary structure layer in the condensation area;
wherein:
the heat dissipation member is a heat pipe, including a plurality of heat dissipation chambers, a heat dissipation medium being arranged in the heat dissipation chambers, and the capillary structure layer being arranged at chamber bodies of the heat dissipation chambers;
the heat pipe includes a number n annular pipe bodies, an i-th annular pipe body being nested at an outside of an (i−1)-th annular pipe body, hollow chambers among the number n annular pipe bodies accommodating a heat dissipation medium, i and n being integers greater than 1, and i being less than or equal to n; and
the number n annular pipe bodies are provided with the capillary structure layer.

2. The heat dissipation member according to claim 1, wherein:
a thickness of the capillary structure layer in the evaporation area is greater than a thickness of the capillary structure layer in the condensation area, so that a capillary force of the capillary structure layer in the evaporation area is greater than a capillary force of the capillary structure layer in the condensation area.

3. The heat dissipation member according to claim 2, further comprising:
an intermediate area located between the evaporation area and the condensation area, wherein:
the thickness of the capillary structure layer in the evaporation area is greater than a thickness of the capillary structure layer in the intermediate area, and the thickness of the capillary structure layer in the intermediate area is greater than the thickness of the capillary structure layer in the condensation area; or
the thickness of the capillary structure layer gradually decreases in the evaporation area, the intermediate area, and the condensation area.

4. The heat dissipation member according to claim 1, wherein:
porosity of the capillary structure layer in the evaporation area is smaller than porosity of the capillary structure layer in the condensation area, a capillary force of the capillary structure layer in the evaporation area is greater than a capillary force of the capillary structure layer in the condensation area.

5. The heat dissipation member according to claim 2, further comprising:
an intermediate area located between the evaporation area and the condensation area, wherein:
the porosity of the capillary structure layer in the evaporation area is smaller than porosity of the capillary structure layer in the intermediate area, and the porosity of the capillary structure layer in the intermediate area is smaller than the porosity of the capillary structure layer in the condensation area; or
the porosity of the capillary structure layer gradually increases in the evaporation area, the intermediate area, and the condensation area.

6. The heat dissipation member according to claim 3, wherein:
a part of the capillary structure layer in the evaporation area is obtained by sintering first material particles;
a part of the capillary structure layer in the condensation area is obtained by sintering second material particles; and
an average particle diameter of the first material particles is smaller than an average particle diameter of the second material particles, so that the porosity of the capillary structure layer in the evaporation area is smaller than the porosity of the capillary structure layer in the condensation area.

7. The heat dissipation member according to claim 1, wherein:
porosity of the capillary structure layer in the evaporation area is smaller than porosity of the capillary structure layer in the condensation area, and a thickness of the capillary structure layer in the evaporation area is greater than a thickness of the capillary structure layer in the condensation area, a capillary force of the capillary structure layer in the evaporation area is greater than a capillary force of the capillary structure layer in the condensation area.

8. An electronic apparatus comprising a heat dissipation member, the heat dissipation member including:
a condensation area arranged away from a heating element of an electronic apparatus in an application state;
an evaporation area arranged close to the heating element in the application state; and
a capillary structure layer, a capillary force of the capillary structure layer in the evaporation area being greater than a capillary force of the capillary structure layer in the condensation area;
wherein:
the heat dissipation member is a heat pipe, including a plurality of heat dissipation chambers, a heat dissipation medium being arranged in the heat dissipation chambers, and the capillary structure layer being arranged at chamber bodies of the heat dissipation chambers;
the heat pipe includes a number n annular pipe bodies, an i-th annular pipe body being nested at an outside of an (i−1)-th annular pipe body, hollow chambers among the number n annular pipe bodies accommodating a heat dissipation medium, i and n being integers greater than 1, and i being less than or equal to n, and
the number n annular pipe bodies are provided with the capillary structure layer.

9. The apparatus according to claim 8, wherein:
a thickness of the capillary structure layer in the evaporation area is greater than a thickness of the capillary structure layer in the condensation area, a capillary force of the capillary structure layer in the evaporation area is greater than a capillary force of the capillary structure layer in the condensation area.

10. The apparatus according to claim 9, the heat dissipation member further comprising:
an intermediate area located between the evaporation area and the condensation area, wherein:
the thickness of the capillary structure layer in the evaporation area is greater than a thickness of the capillary structure layer in the intermediate area, and the thickness of the capillary structure layer in the intermediate area is greater than the thickness of the capillary structure layer in the condensation area; or
the thickness of the capillary structure layer gradually decreases in the evaporation area, the intermediate area, and the condensation area.

11. The apparatus according to claim 8, wherein:
porosity of the capillary structure layer in the evaporation area is smaller than porosity of the capillary structure layer in the condensation area, a capillary force of the capillary structure layer in the evaporation area is greater than a capillary force of the capillary structure layer in the condensation area.

12. The apparatus according to claim 11, the heat dissipation member further comprising:
an intermediate area located between the evaporation area and the condensation area, wherein:
the porosity of the capillary structure layer in the evaporation area is smaller than porosity of the capillary structure layer in the intermediate area, and the porosity of the capillary structure layer in the intermediate area is smaller than the porosity of the capillary structure layer in the condensation area; or
the porosity of the capillary structure layer gradually increases in the evaporation area, the intermediate area, and the condensation area.

13. The apparatus according to claim 11, wherein:
a part of the capillary structure layer in the evaporation area is obtained by sintering first material particles;
a part of the capillary structure layer in the condensation area is obtained by sintering second material particles; and
an average particle diameter of the first material particles is smaller than an average particle diameter of the second material particles, the porosity of the capillary structure layer in the evaporation area is smaller than the porosity of the capillary structure layer in the condensation area.

14. The apparatus according to claim 8, wherein:
porosity of the capillary structure layer in the evaporation area is smaller than porosity of the capillary structure layer in the condensation area, and a thickness of the capillary structure layer in the evaporation area is greater than a thickness of the capillary structure layer in the condensation area, a capillary force of the capillary structure layer in the evaporation area is greater than a capillary force of the capillary structure layer in the condensation area.

15. The heat dissipation member according to claim 1, wherein the heat dissipation chambers are parallel to each other.

16. The apparatus according to claim 8, wherein the heat dissipation chambers are parallel to each other.

17. The heat dissipation member according to claim 1, wherein:
the capillary structure layer is sintered on inner and outer surfaces of a first annular pipe body to an (n−1)-th annular pipe body and on an inner surface of the n-th annular pipe body.

* * * * *